(12) United States Patent
Sontag et al.

(10) Patent No.: US 6,407,756 B1
(45) Date of Patent: Jun. 18, 2002

(54) GRAPHICAL USER INTERFACE FOR A LOGIC ANALYZER WHICH ALLOWS SIMPLIFIED CLOCK SELECTION

(75) Inventors: David N Sontag; Jeffrey Erickson Roeca, both of Colorado Springs, CO (US); Frank D Simon, Eagle River, AK (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/302,065

(22) Filed: Apr. 29, 1999

(51) Int. Cl.⁷ .......................... G06F 3/14; G06F 17/00
(52) U.S. Cl. ...................... 345/771; 345/763; 345/764; 345/773; 345/835; 702/57; 702/66; 702/67; 702/68
(58) Field of Search .................. 345/771, 773, 345/965, 835, 839, 796, 440.1, 840, 781, 764, 763; 702/57, 66, 67, 68, 117

(56) References Cited

U.S. PATENT DOCUMENTS

| | | | |
|---|---|---|---|
| 4,763,117 A | 8/1988 | Blattner et al. | 340/712 |
| 4,972,138 A | 11/1990 | Bush | 324/73.1 |
| 5,081,592 A * | 1/1992 | Jenq | 702/68 |
| 5,592,390 A * | 1/1997 | Liken et al. | 702/67 |
| 6,262,728 B1 * | 7/2001 | Alexander | 345/334 |
| 6,327,544 B1 * | 12/2001 | Samuels | 702/70 |

* cited by examiner

*Primary Examiner*—Raymond J. Bayerl
*Assistant Examiner*—Thomas T. Nguyen

(57) ABSTRACT

Provided is a graphical user interface for a logic analyzer that allows for simplified clock configuration selection. The graphical user interface consolidates all clock selection functions onto a single screen, allowing for ease of understanding and navigation.

14 Claims, 16 Drawing Sheets

GRAPHICAL USER INTERFACE FOR A LOGIC ANALYZER WHICH ALLOWS SIMPLIFIED CLOCK SELECTION

FIELD OF THE INVENTION

The present invention pertains generally to logic analyzer user interfaces, and more particularly to a user interface that allows simplified clock selection.

BACKGROUND OF THE INVENTION

As known by those skilled in the art, a logic analyzer is an electronic instrument used to detect, analyze, and display digital voltage signals. Logic analyzers provide many configuration functions as a result of the increasing operational complexity of target devices. In many measurement applications, however, not all of the configuration functions are needed to obtain simple measurements—that is, the necessary configuration functions are selected in accordance with level of measurement complexity.

Conventional logic analyzers include a graphical user interface that allows a user to make selections with respect to the configuration functions. The graphical user interface is generally made available on a display integrated with the logic analyzer, and may additionally be made available on a remote terminal that communicates with the logic analyzer. In prior art logic analyzers, the user is required to make selections with respect to all the configuration functions, even if the desired measurements do not require some of the configuration functions. The user must select a "don't care" value with respect to an unnecessary configuration function. These unnecessary configuration function setting operations are time-consuming. Furthermore, the complex array of a configuration settings renders the setup of the logic analyzer confusing to unskilled or unfamiliar users of the logic analyzer.

A logic analyzer generally allows data sampling in one of two clock modes—either state mode or timing mode. In a state mode measurement, the logic analyzer is clocked by a signal from the system under test. Each time the clock signal becomes valid, the analyzer samples data from the system under test. Since the analyzer is clocked by the system, state measurements are synchronous with the test system. In a timing measurement, the logic analyzer samples data at regular intervals according to a clock signal internal to the timing analyzer. Since the analyzer is clocked by a signal that is not related to the system under test, timing measurements capture traces of electrical activity over time. These measurements are asynchronous with the test system.

Clock setup must be correctly accomplished in order for a synchronous sampling (i.e., state mode) measurement to be acquired by the logic analyzer. In previous user interface implementations, the portion of the user interface which facilitates the specification of clocks has been distributed over several unrelated setup windows accessed from within the logic analyzer's graphical user interface. A prior art graphical user interface clock setup dialog is shown in FIGS. 1 and 2.

FIG. 1(a) is a prior art logic analyzer user interface illustrating an example setup window 2 of a prior art logic analyzer. Setup window 2 comprises four tabs: Config tab 20 which allows the user to set up the measurement configuration of a machine, Format tab 40 which allows the user to setup the format in which to display the captured measurements, Trigger tab 60 which allows the user to set up the point on which data is captured, and Symbol tab 80 which allows the user to map alphanumeric symbols to raw data.

FIG. 1(a) displays the Config tab 20. The Config tab 20 selections are displayed by clicking, using a mouse, on the Config tab 20. The Config tab 20 selections tell the logic analyzer how the hardware (i.e., the available logic analyzer pods) is connected. In the illustrative embodiment, the logic analyzer allows the user to define and connect to up to two different machines, in the illustrative embodiment named MACHINE 1 and MACHINE 2. In this embodiment, the logic analyzer is capable of operating as a two-analyzer machine and represents both machines under the Config tab 20, allowing the user to rename the machines to any names desired. The assigned names are shown wherever appropriate under the other tabs to identify the associated machine settings.

Config tab 20 comprises a machine window 21 and 31 for each machine. Each machine window 21 and 31 comprises a respective name display 22 and 32 to identify its associated machine, and a respective machine type button 24 and 34 which toggles either to a timing type or a state type, or an "off" state in which the machine does not operate. The setting of the machine type button 24 and 34 communicates to the logic analyzer to operate either as a timing analyzer or a state analyzer. In FIG. 1(a), MACHINE 1 is set to operate in timing mode, and MACHINE 2 is set to off.

Each machine window 21 and 31 also comprises an assigned pod window 26 and 36, which displays the pods assigned to that particular machine. In the illustrative embodiment, pods A1 and A2 are assigned to MACHINE 1, and MACHINE 2 has no pods assigned to it. Each pod A1, A2, A3, A4, A5 and A6 has a clock associated with it, labeled J, K, L, M, N and P, respectively. The user assigns pods to one or the other of the two machines by selecting a pod displayed in the unassigned pod window 38 and dragging it to the assigned pod window 26 or 36 as appropriate. Activity occurring on each pin of a pod is displayed as a double arrow. No activity is displayed as a dash.

Once the machine type and assigned pods are set up, the user must obtain the format selections by clicking the Format tab 40, shown in FIG. 1(b). The format selections tell the logic analyzer how to use its internal resources Format tab 40 includes an operating mode button 51, which defines the operating mode of the machine. In the example of FIG. 1(b), MACHINE 1 is set to operate in timing mode at 333 MHz, with a memory depth of 128K samples. Format tab 40 includes a data level button 43, 53 for each assigned pod indicated by labels 42, 52, which defines the data levels of the signals received on each channel associated with the respective pod. In addition, Format tab 40 includes a set of labels 44 for bits or sets of bits that will be monitored during a measurement (also called a "trace"). The user may define the labels 44 associated with bits or sets of bits of the assigned pods. Each label has a clock definition control 45, a first associated pod definition control 46, and a second associated pod definition control 47. The user clicks on the desired pod definition control 45, 46, 47, which activates a pop-up menu 59 that allows the user to click on the individual bits of the ass pod definition to define which bits to monitor. The monitored bits are displayed with a "*", and the un-monitored bits are displayed with a ".". An activity indicator line 48 indicates which bits are active by displaying a "↕".

Once the format of the data and clock lines are set up, the user clicks on the Trigger tab 60, shown in FIG. 1(c), to set up the trigger. A trigger is a reference event around which information is gathered. For example, in a logic analyzer, the user might wish to trigger on a glitch on a hardware line when operating in timing mode, or on an entry to a subroutine in software when operating in state mode. Logic analyzers use the trigger specification to determine when to start storing data. When beginning, the trigger might be set up on the first occurrence of any kind (trigger on "anystate"). As the user learns more about the problem, the trigger specification might be modified to enter more specific trigger conditions. A trigger specification is a set of conditions that must be true before the instrument triggers.

Trigger tab 60 includes an "Arming Control" button 61 that allows the user to set up the arming sequence between the two machines MACHINE 1 and MACHINE 2. A logic analyzer machine must be armed before it can search for its trigger condition. Typically, machines are armed immediately when a "Run" or a "Group Run" is selected. Alternatively, arming control can be used to set up one machine to arm another. In this setup, the second machine cannot search for its trigger condition until it receives the arming signal from the first machine.

A sampling period control 62 allows the user to set the period of the internal sampling clock. A trigger position control 63 allows the user to instruct the logic analyzer to store data measurements collected either leading up to the trigger event, after the trigger event, or evenly distributed before and after the trigger event.

Trigger tab 60 also includes a trigger resource definition frame 64, which includes a pattern tab 65 for setting up trigger pattern options, an edge tab 66 for defining the trigger edges, a range tab 67 for configuring the trigger ranges, and a timer tab 68 for setting up timers. In the illustrative embodiment, the Edge tab 66 is displayed. Edge tab 66 displays the configuration for two edges. Each edge configuration includes an edge name field 69, a label field 70, and a defined edge field 71. Clicking on the defined edge field 71 pops up an edge definition window 72, shown in FIG. 1(d), that includes an edge definition field 73. An edge term can be set to detect a rising edge (↑), falling edge (↓), either edge (↕), no edge (.), or a glitch (*) on an input signal. Once the trigger definition is configured, the trigger sequence is set up by clicking on the trigger sequence level button 77, which pops up a trigger sequence window 74, shown in FIG. 1(e). Trigger sequence window 74 includes a boolean sequence layout that allows the user to set up a boolean trigger sequence.

Symbols tab 80 allows the user to define labels that represent patterns and ranges of values found on sets of pod bits.

FIG. 2(a) displays the Config tab 20, where MACHINE 1 is set to operate in state mode, and MACHINE 2 is set to off. Again, pods A1 and A2 are assigned to MACHINE 1, and MACHINE 2 has no pods assigned to it. Clocks J and K, on pods A1 and A2, are assigned to MACHINE 1. Activity occurring on each pin of the pods are displayed as a double arrow.

Once the machine type and assigned pods are set up, the user must obtain the format selections by clicking the Format tab 40, shown in FIG. 2(b). The format selections tell the logic analyzer how to use its internal resources. Format tab 40 includes an operating mode button 51, which defines the operating mode of the machine. In the example of FIG. 2(b), MACHINE 1 is set to operate in state mode at 100 MHz, with a sample depth of 128K.

Format tab 40 includes a pod clock control button 81 and 82 for each associated pod indicated in respective labels 42 and 52. When the user clicks on a pod clock control button 81 or 82, a popup menu 83 appears to allow the user to set up the clock associated with the pod to one of either Master Clock, Slave Clock, or Demultiplex mode. In Master Only mode, data on a pod that is designated a master clock is latched and strobed into analyzer memory when the status of the master clock inputs meet the requirements of the master clocking arrangement.

In Slave Only mode, data on a pod that is designated a slave clock is latched when the status of the slave clock inputs meet the requirements of the slave clocking arrangement. Then, followed by a valid master clock, the slave data is strobed into analyzer memory along with the master data. If multiple slave clocks occur between master clocks, only the data latched by the last slave clock prior to a valid master clock is strobed into analyzer memory.

Demultiplex mode is used to store two different sets of data that occur at different times on the same channels. In Demultiplex mode, only one pod of the pod pair is used, and that pod is selectable. Channel assignments are displayed as Demultiplex and Slave. Assign slave and master data to separate labels for easy recognition of the two sets of data. Both the master and slave clocks are used in the Demultiplex mode. When the analyzer sees a match between the slave clock input and the slave clock arrangement, demultiplexed slave data is latched. Then, following a valid master clock, the slave data is strobed into analyzer memory along with the master data. If multiple slave clocks occur between master clocks, only the data latched by the last slave clock prior to the master clock is strobed into analyzer memory.

Format tab 40 also includes a machine clock button 54, which allows the user to define how the machine's data will be sampled into memory. In the example of FIG. 2(b), the machine clock is set to Master Clock. Once the machine clock is assigned one of three clock arrangements, its clock follows the configuration in the master and slave clock fields defined in a separate dialog. The machine clock button 54 and its associated clocking arrangement are only available when the machine is set up as a state analyzer.

Clicking on the machine clock button 54 pops up a master clock configuration window 84 in a separate dialog box. The master clock configuration window 84 includes buttons for setting the sampling edges of the various clocks available to the machine, along with the ability to set qualifiers Q1, Q2, Q3, Q4. This is shown in FIG. 2(c). In the example of FIG. 2(b), the master clock sets clock channel J on pod A1 to sample data on the rising edge.

FIG. 2(b) also shows a label SCOUNT 55 defined as the lower 8 channels of pod A1.

FIG. 2(d) shows the pattern tab 65 of trigger tab 60. In this example, two events EVENT3 85 and EVENT10 86 are defined as the decimal value 3 and 10 respectively. FIG. 2(e) shows the range tab 67 of trigger tab 60. In this example, a range RANGE4–9 73 is defined as the range between and including the decimal values 4 through 9.

Trigger sequence frame 76 shows the sequencing levels on trigger tab 60. In this example, the trigger sequence is set to store "anystate", then trigger upon the occurrence of "EVENT3" once, and then store only patterns matching the range RANGE4–9 or EVENT10. Each sequence "1" and "2" is set up by clicking on the respective sequence number button 77 and 78, which pops up the trigger sequence window shown in FIG. 1(e).

It is clear from the above description that the prior art logic analyzer user interface design allows great flexibility in defining Boolean combinations of clock edges and qualifiers. However, the design is problematic for several reasons.

First, the clock labels (e.g., J, K, L, and M) are abstract. The prior art user interface provides no indication of which clock belongs to which analyzer pod (i.e., the J clock is on Pod B1). This information is critical because the user needs to know which clock line is connected to the target system. However, in order to locate this information, the user must navigate to an entirely different screen (i.e., Config tab 20) in the user interface.

Second, in order to verify that the clock line has been correctly connected to the device under test, the user needs some indication that there is signal activity on a particular clock line. To locate this information in the user interface, the user must navigate to an entirely different setup screen (i.e., Format tab 40) to view the activity.

Another problem with the previous user interface implementation of the clock setup interface is the complexity of the interface. The clock setup user interface in the prior art is designed to allow very complicated Boolean combinations of edges and qualifiers to be specified. Users must navigate through the complexity of the interface necessary for allowing these advanced equations even when they are attempting to specify a very simple clock. By making it easier to set up these advanced specifications, the conventional user interface complicates the simpler and more common specifications.

Yet another problem of previous user interface designs is that the complexity of the user interface makes it necessary to place the clock setup in a separate dialog box (popup screen 54 of Format tab 40) rather than containing it on a single screen with other associated sampling options. This diminishes ease of use because it increases the amount of navigation through the user interface by the user.

Finally, when specifying both Master and Slave clocks, the complexity of the user interface of previous designs dictates that the master and slave clocks be specified in separate dialog boxes (e.g., popup screen 54 of Format tab 40). This makes it very difficult to see the resulting equations until setup is complete.

Accordingly, a need exists for a more straightforward user interface for a logic analyzer which allows simplicity in clock setup.

SUMMARY OF THE INVENTION

The present invention is a novel user interface for a logic analyzer that allows for simplified clock configuration selection. The graphical user interface consolidates all clock selection functions onto a single screen, allowing for ease of understanding and navigation.

In accordance with the invention, the graphical user interface is operative to receive and interpret logic analyzer signals to display logic analyzer information for a user, and to receive and interpret user input to configure the logic analyzer in accordance with the user input. The graphical user interface comprises a clock specification grid that consolidates all the clock setup configuration functions onto one user screen. The clock specification grid includes a pod identifier section comprising a plurality of pod labels, each of which corresponds to a physical pod of the logic analyzer that has a clock line. Each pod label identifies a respective pod name of its respective corresponding analyzer pod. Preferably, each of the pod labels is color coded to match the color of the label on the physical pod at the end of each logic analyzer cable. The clock specification grid includes a clock identifier section that includes a plurality of clock labels, each of which corresponds to one of the analyzer pods. The clock specification grid also includes an activity indicator section that comprises a plurality of activity indicators that indicate whether there is activity present on the clock associated with the respective analyzer pod. The clock specification grid also includes a master clock selection section. When operating in a normal mode, the master clock selection section includes a plurality of master clock selection buttons, each of which corresponds to one of the analyzer pods and allows the user to select a clock edge on which the associated clock operates. The master clock selection buttons offer the option of setting up the respective clock to be Off, Rising Edge, Falling Edge, Both Edges, Qualifier-High, or Qualifier-Low. Preferably, the master clock selection button displays the selected clock selection option. When operating in advanced clocking mode, the master clock selection section is a single master clock selection button that pops up an advanced clock selection window when clicked.

Preferably, the graphical user interface implements, among other features, a clock setup frame that contains the clock specification grid, along with a clock mode control that allows the user to set the logic analyzer clock mode. When selected, the clock mode determines the options presented in the clock specification grid.

Preferably, the graphical user interface implements a acquisition mode control frame comprising the clock setup frame and an operating mode button that defines the operating mode of the logic analyzer machine, which may be set up as at least either a state mode or a timing mode.

The simplified clock setup user interface of the invention provides several advantages over the prior art. First, the grid layout of the clocks and their setting used in the simplified clock setup user interface presents all of the pertinent information, including the pod number, its associated clock label, clock activity and the edge or qualifier selection, to the user in a single place, thereby allowing the clock setup to be more efficient over previous implementations of the clock setup which required the user to extract important information from multiple screens. Second, the layout of the user interface allows the user to build both simple and more complicated equations but does not highlight complex settings at the cost of simple settings. This overcomes the problems of the previous implementation layouts, which allowed the user to build both simple and complex settings at the cost of simple settings. By presenting all of the clock setup options all of the time, the previous implementations of clock setup user interfaces highlighted the advanced complexity that was possible and, in the process, over complicated the simpler more common specifications. Third, the efficient use of screen space by the invention allows for more information to be displayed but in a small enough space that an additional screen is not necessary. Thus, the simplified clock setup user interface can be displayed on a signal screen along with additional measurement sampling options to thereby simplify navigation. In addition, this new design allows for the display of significantly more pertinent information in a fraction of the space required by the previous implementations. This overcomes the complexity of the previous designs that made it necessary for the clock setup options to be contained in their own separate dialog. Fourth, because of the increased efficiency in the usage of screen space, the simplified clock setup user interface allows the Master and Slave clock setup to be displayed simultaneously on the same screen rather than performed in separate dialogs as in the prior art.

Accordingly, a user can confirm clock activity and verify which clock label is associated with which analyzer pod without navigating to a different screen. In addition, color-coding is preferably used to reinforce the relationship between the pod label in the user interface and the physical logic analyzer pod. Additionally, a user can quickly specify the clock settings within a single screen. An additional dialog only needs to be opened when very complicated specifications are necessary. Another advantage provided by the invention is that the compact space requirements for simplified clock setup user interface allows it to be placed on the same screen as other associated sampling options. Finally, the Simplified Clock Setup design allows a much cleaner, more intuitive presentation of information and options.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel graphical user interface for a logic analyzer that supports simplified clock setup selection is described in detail hereinafter.

Figure 1A:
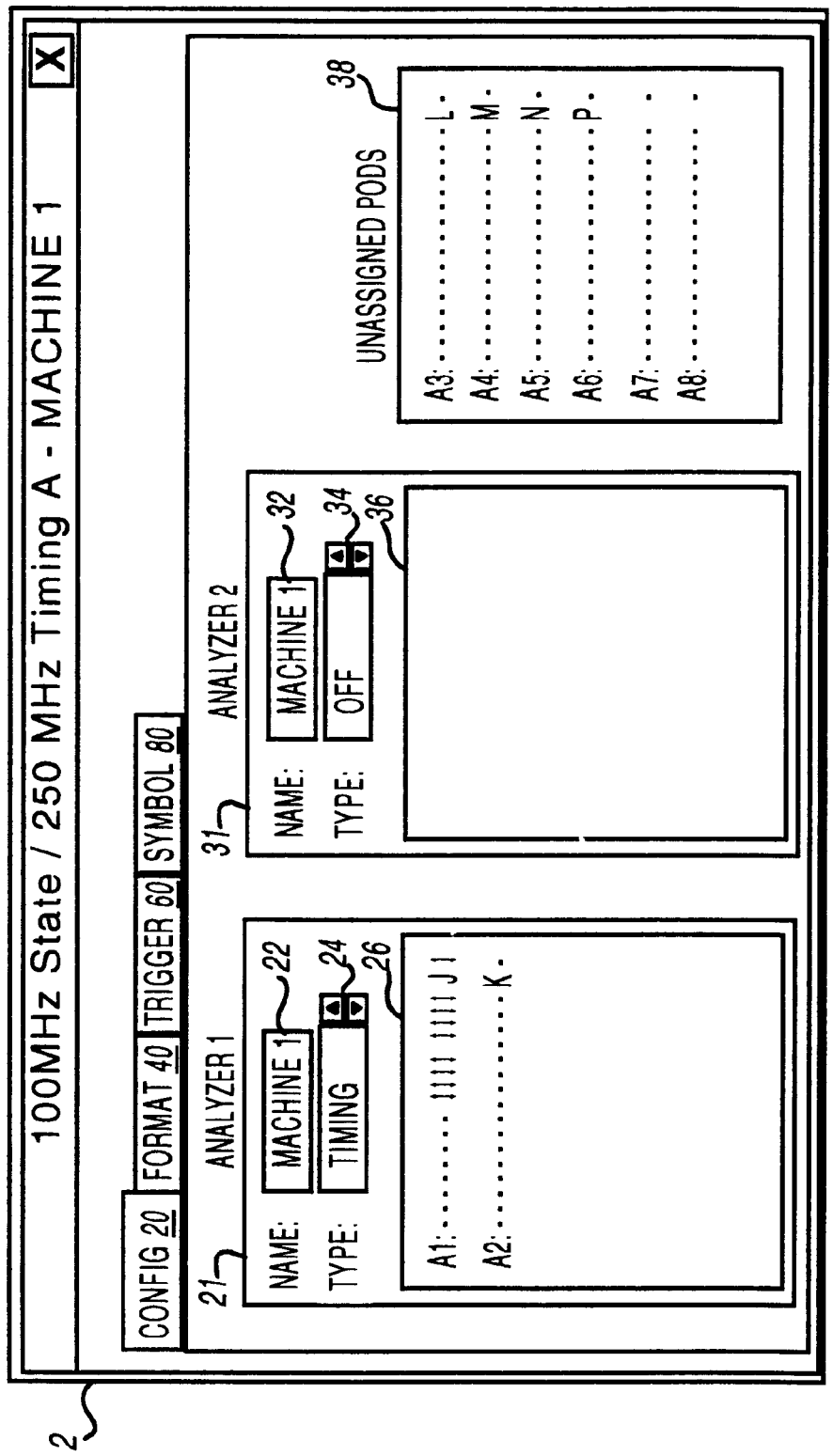
FIG. 1(a) is a prior art logic analyzer user interface illustrating an example timing mode setup window of a prior art logic analyzer.
Figure 1B:
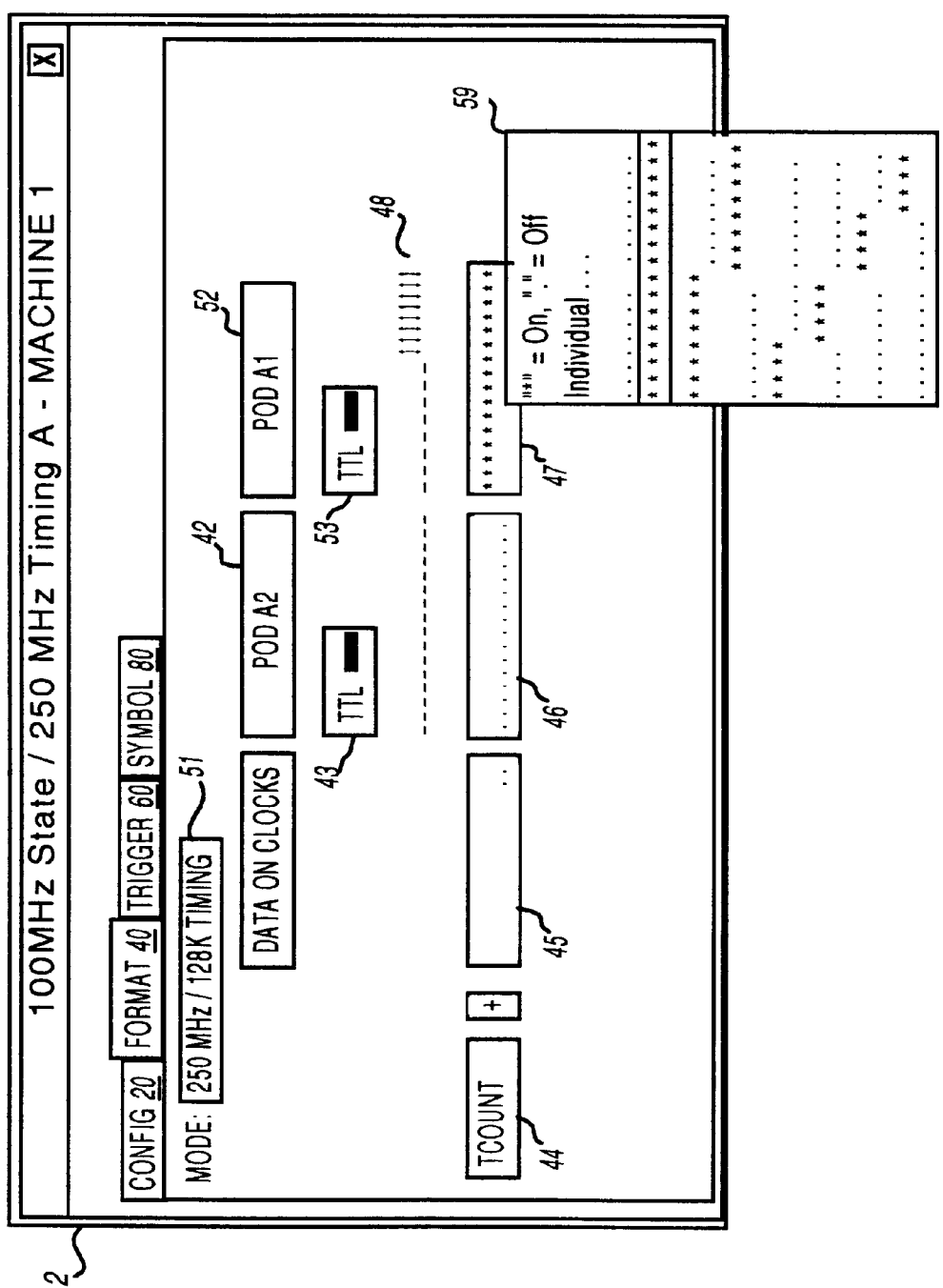
FIG. 1(b) is the prior art logic analyzer user interface of FIG. 1(a) illustrating the Format tab.
Figure 1C:
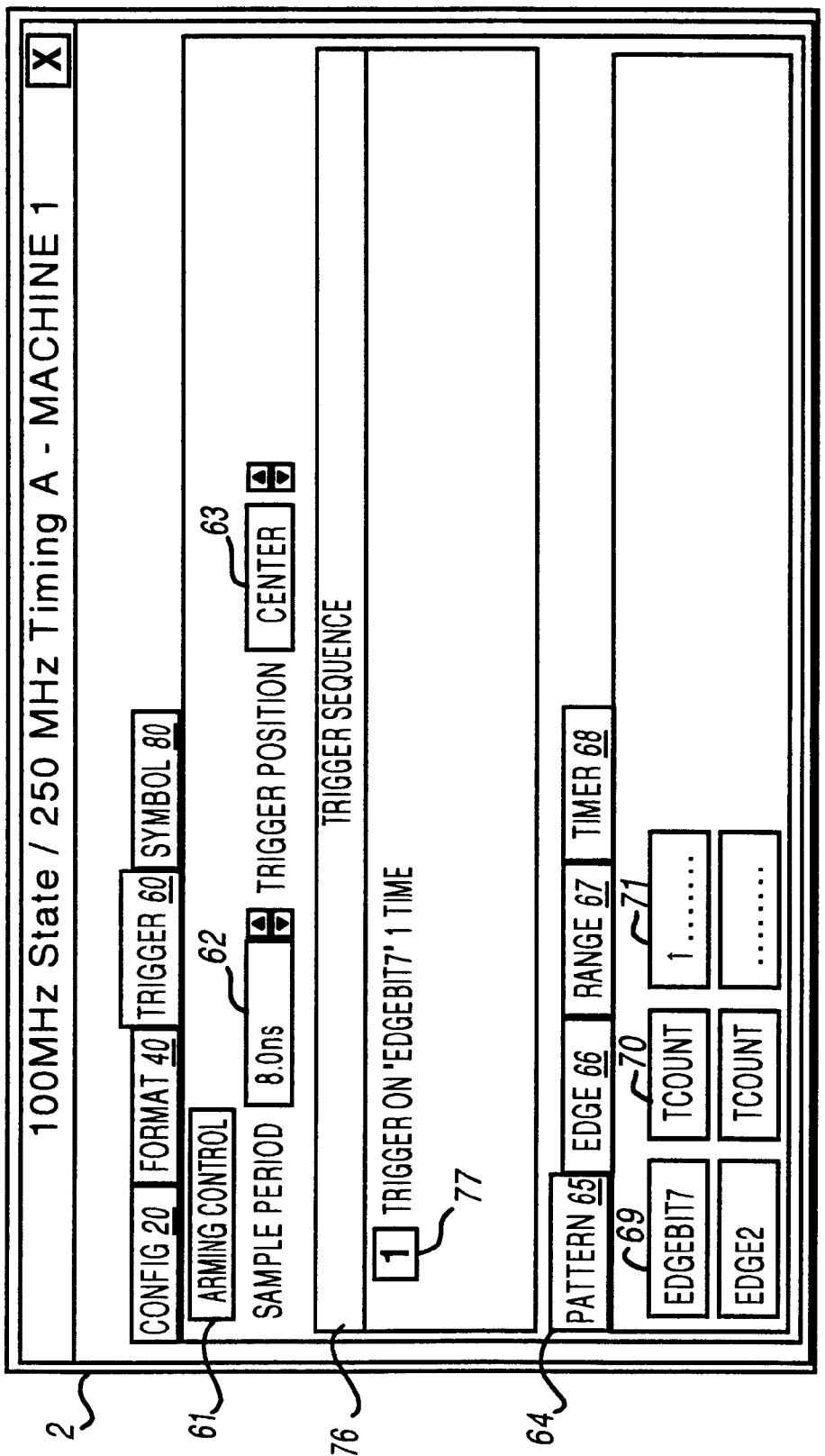
FIG. 1(c) is the prior art logic analyzer user interface of FIG. 1(a) illustrating the Trigger tab.
Figure 1D:
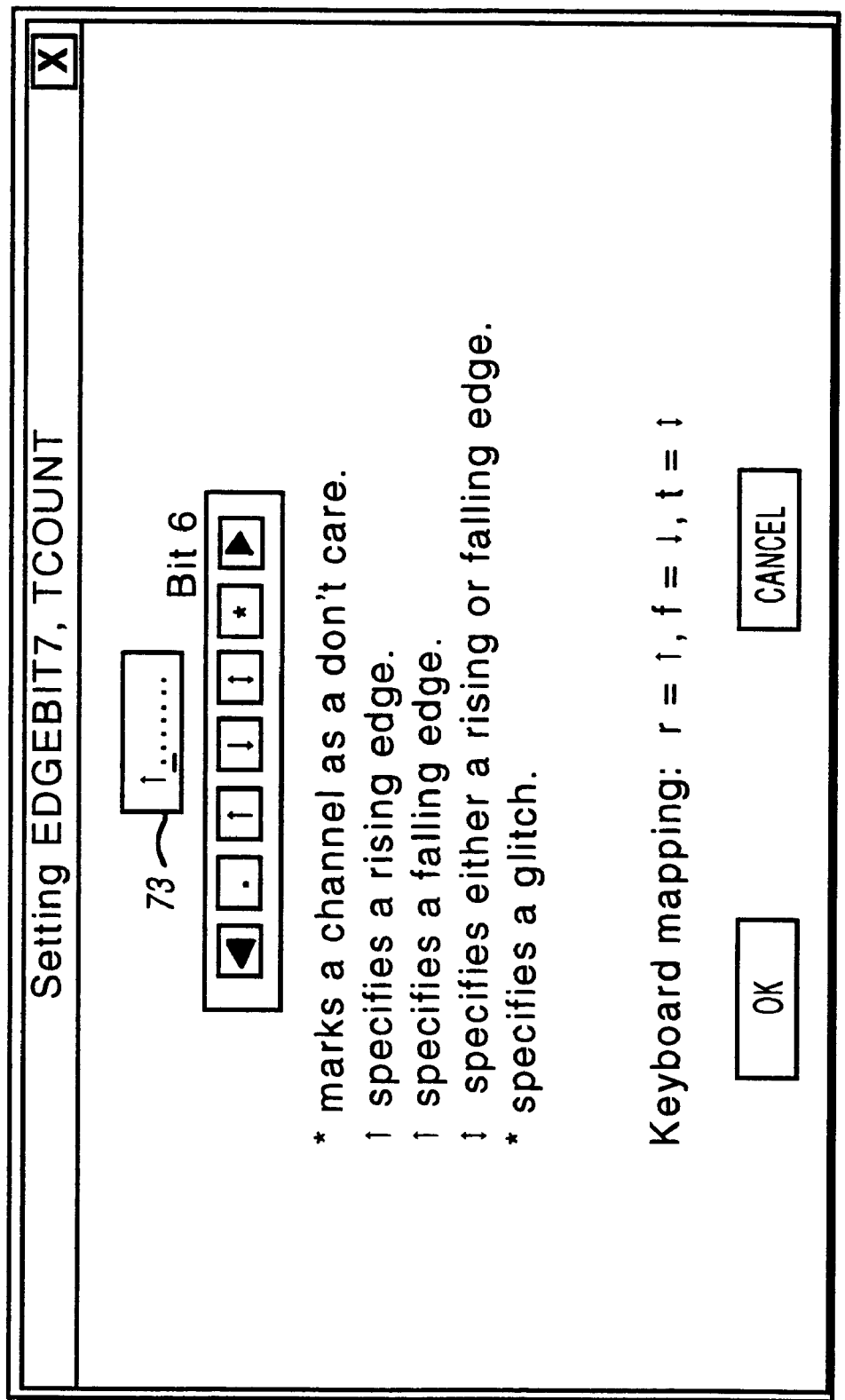
FIG. 1(d) is the prior art logic analyzer user interface of FIG. 1(a) illustrating the edge definition window accessed from the Trigger tab.
Figure 1E:
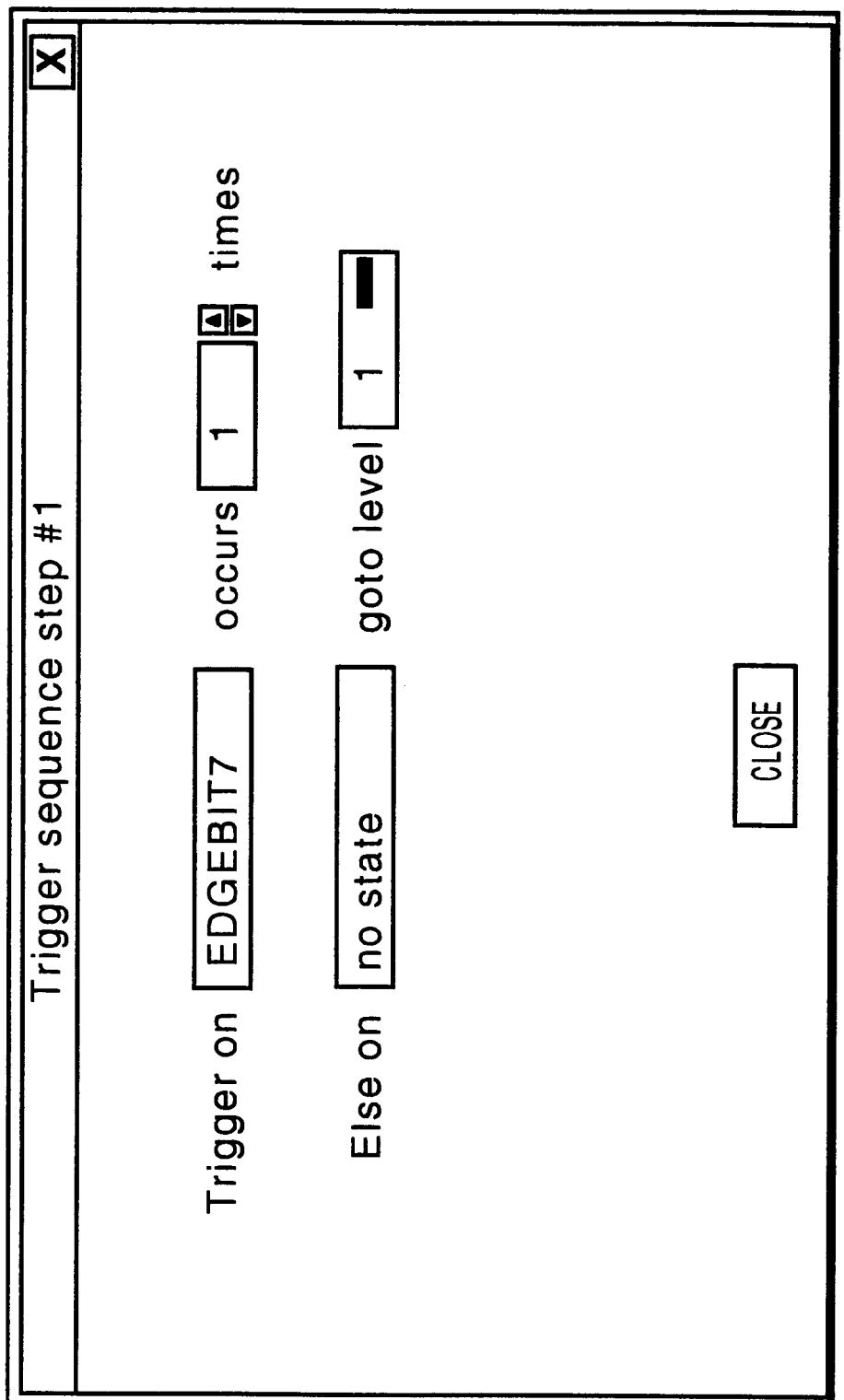
FIG. 1(e) is the prior art logic analyzer user interface of FIG. 1(a) illustrating the trigger sequence window.
Figure 2A:
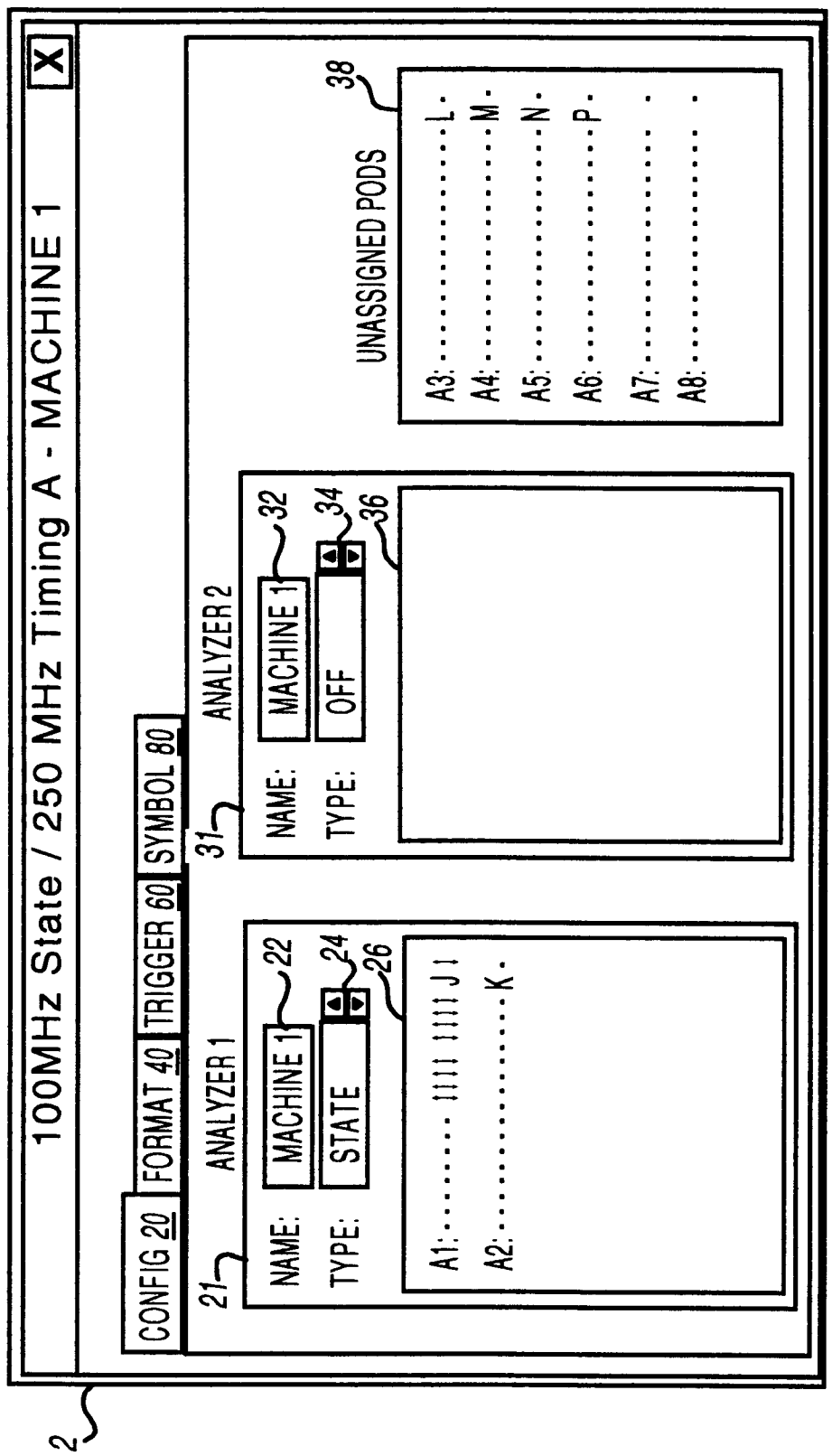
FIG. 2(a) is a prior art logic analyzer user interface illustrating an example state mode setup window of a prior art logic analyzer.
Figure 2B:
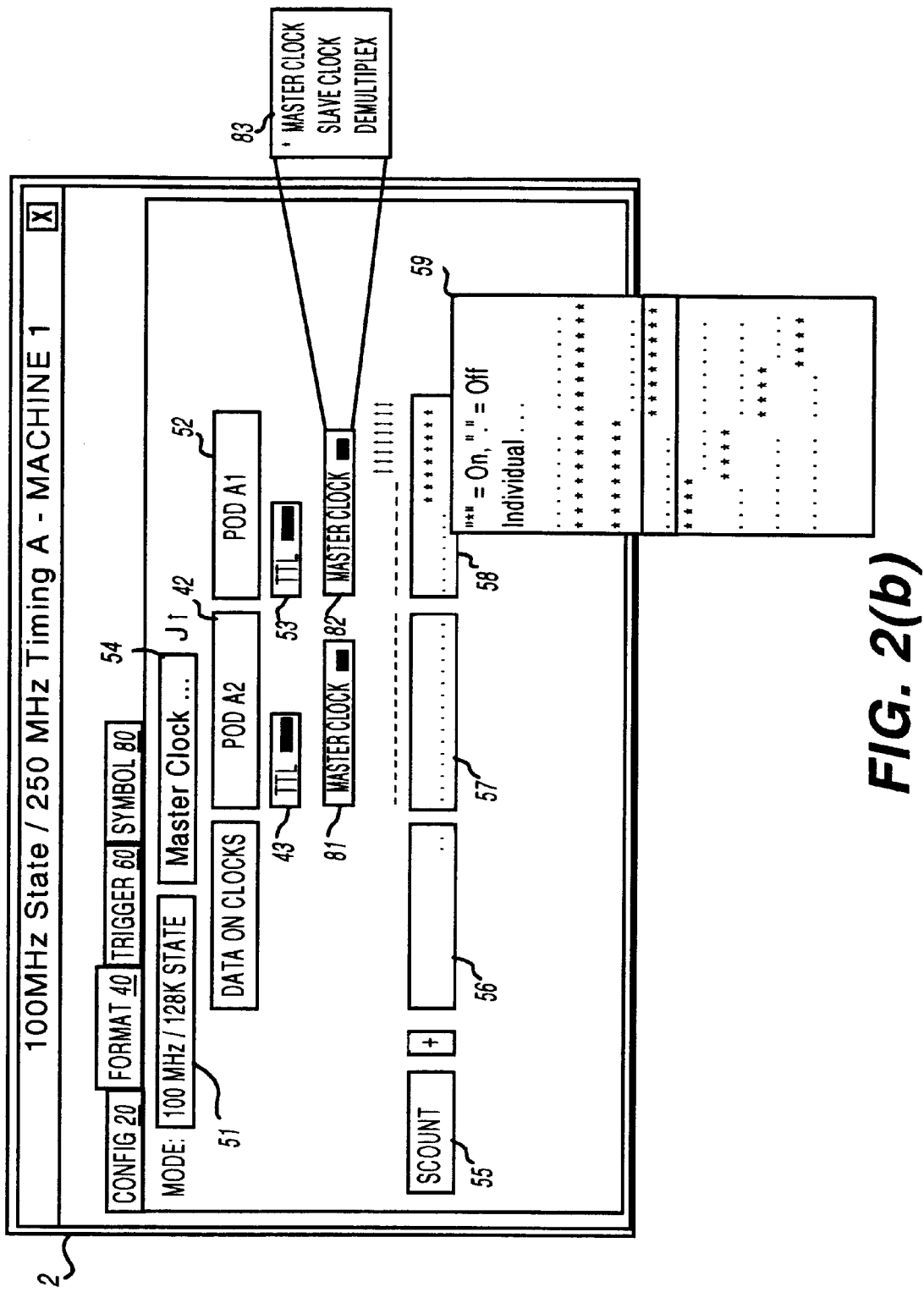
FIG. 2(b) is the prior art logic analyzer user interface of FIG. 2(a) illustrating the Format tab.
Figure 2C:
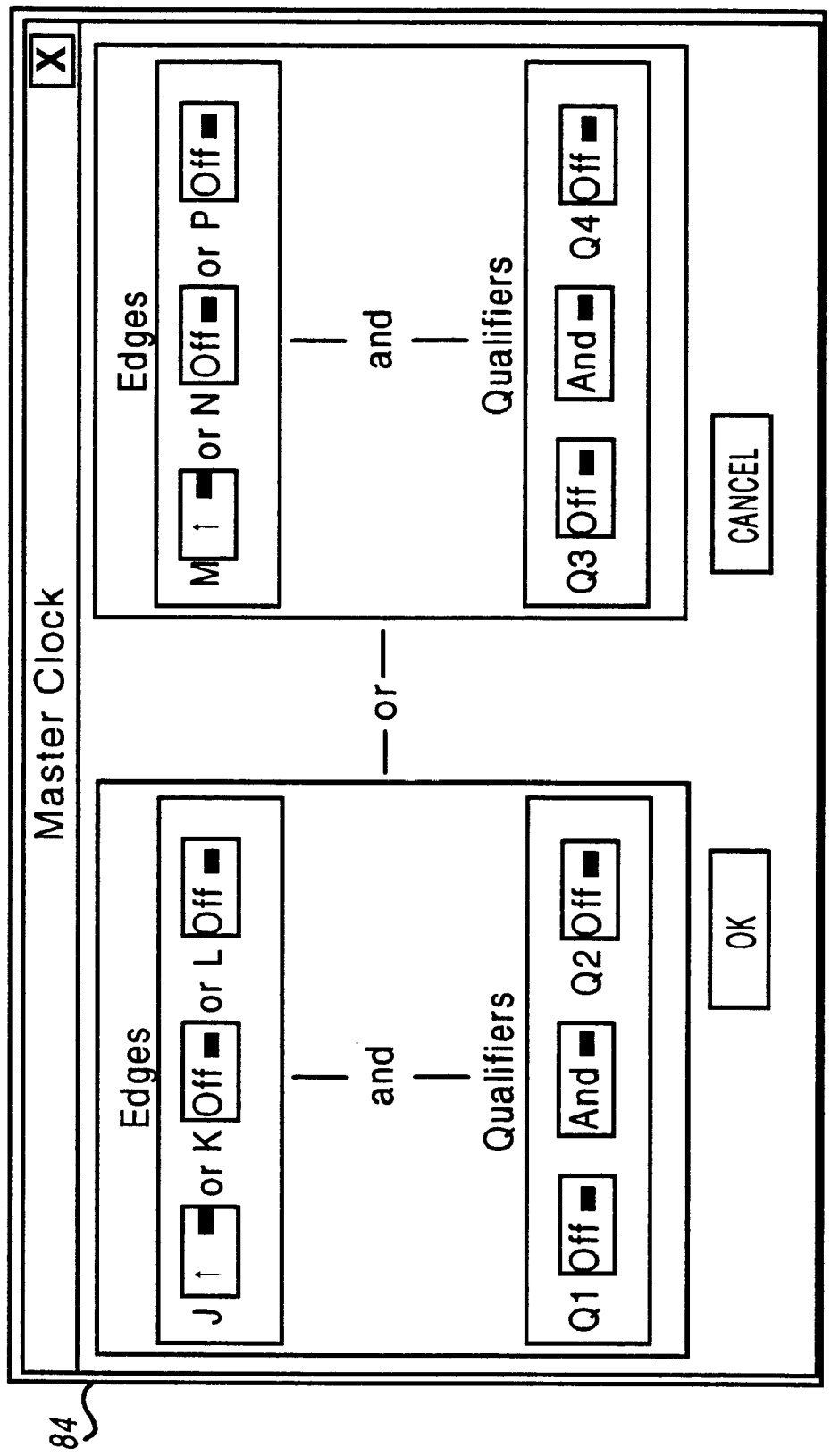
FIG. 2(c) is the prior art logic analyzer user interface of FIG. 2(a) illustrating the master clock configuration window.
Figure 2D:
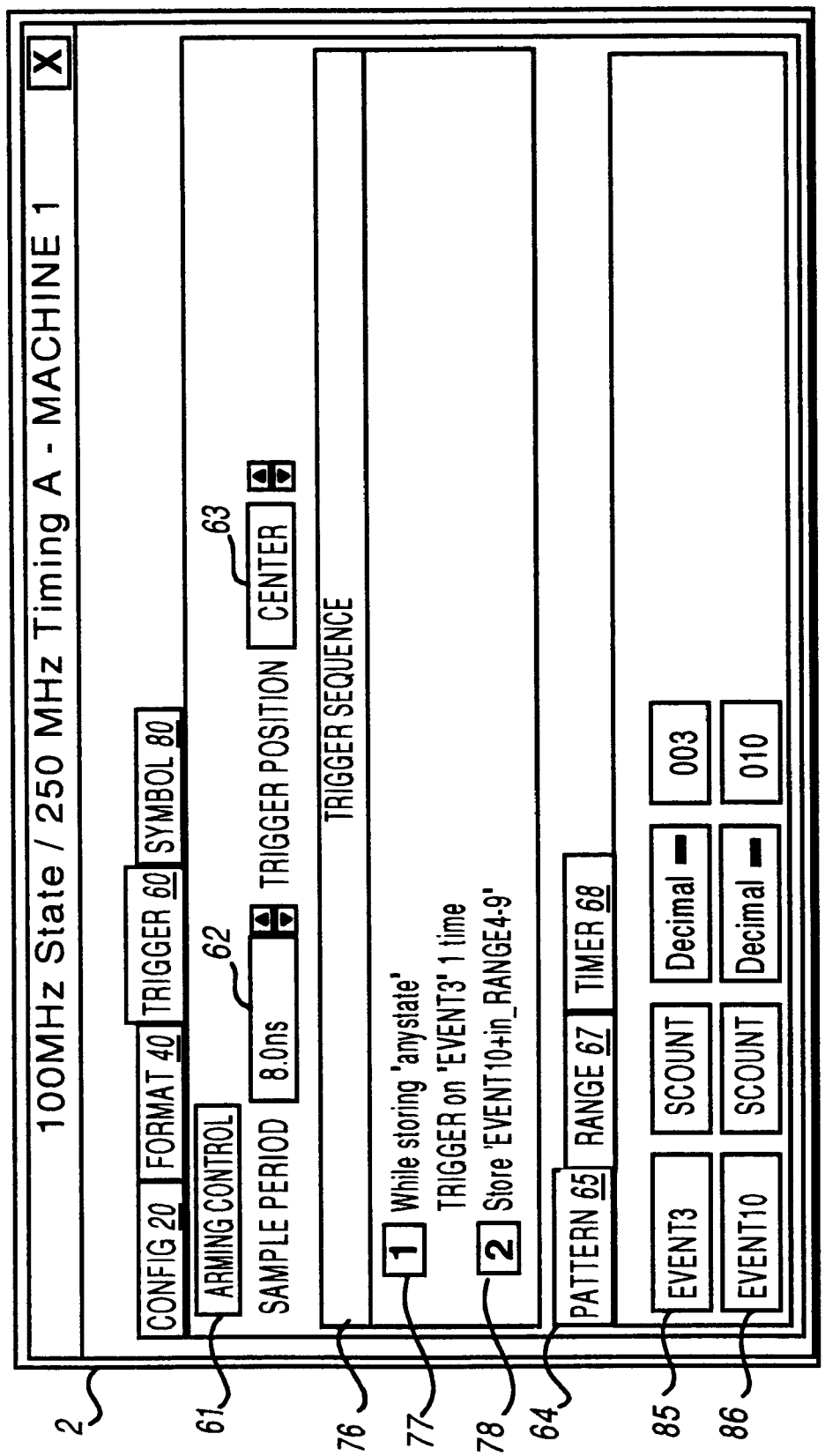
FIG. 2(d) is the prior art logic analyzer user interface of FIG. 2(a) illustrating the Pattern tab in the Trigger tab.
Figure 2E:
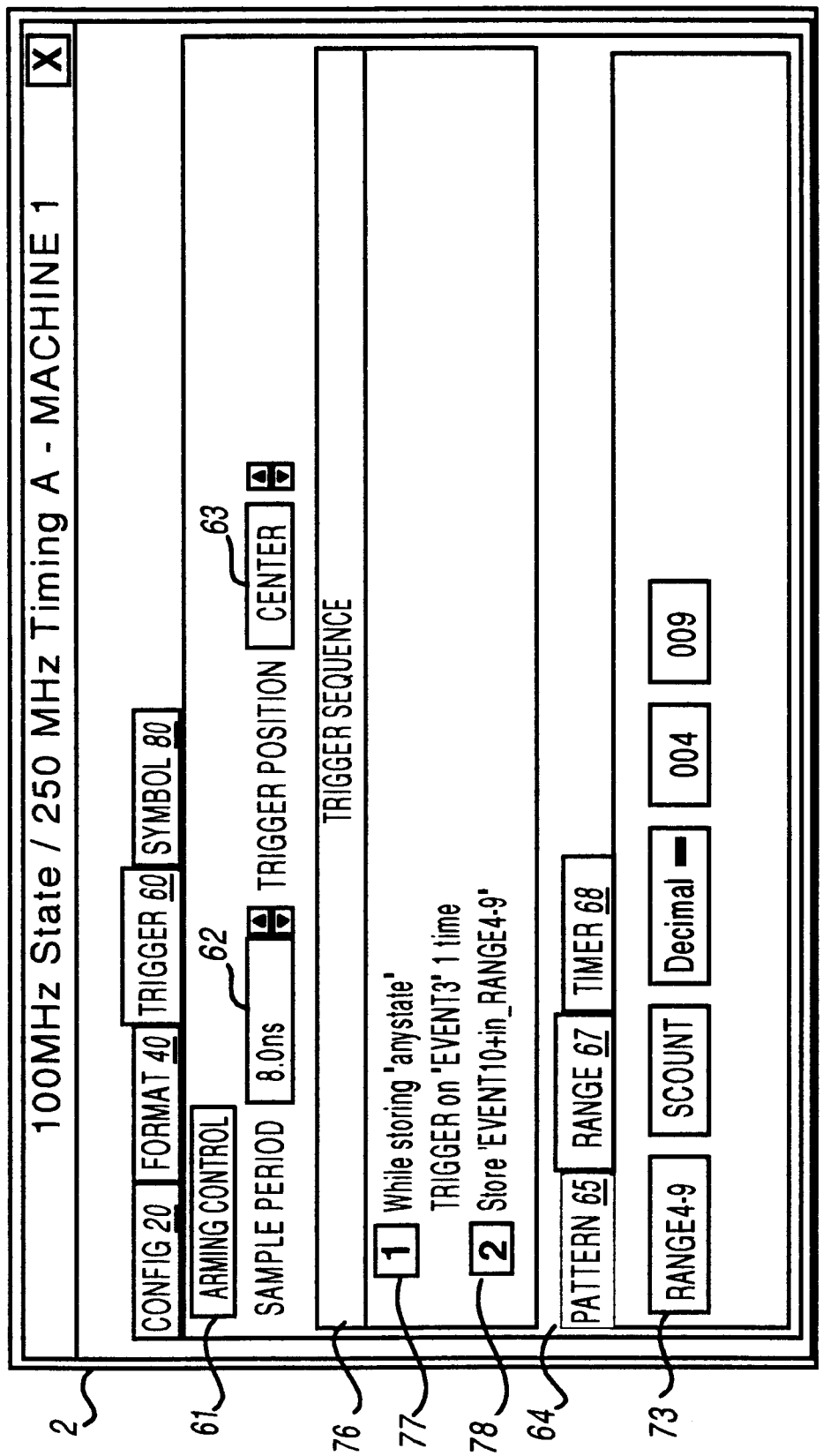
FIG. 2(e) is the prior art logic analyzer user interface of FIG. 2(a) illustrating the Range tab in the Trigger tab.
Figure 3:
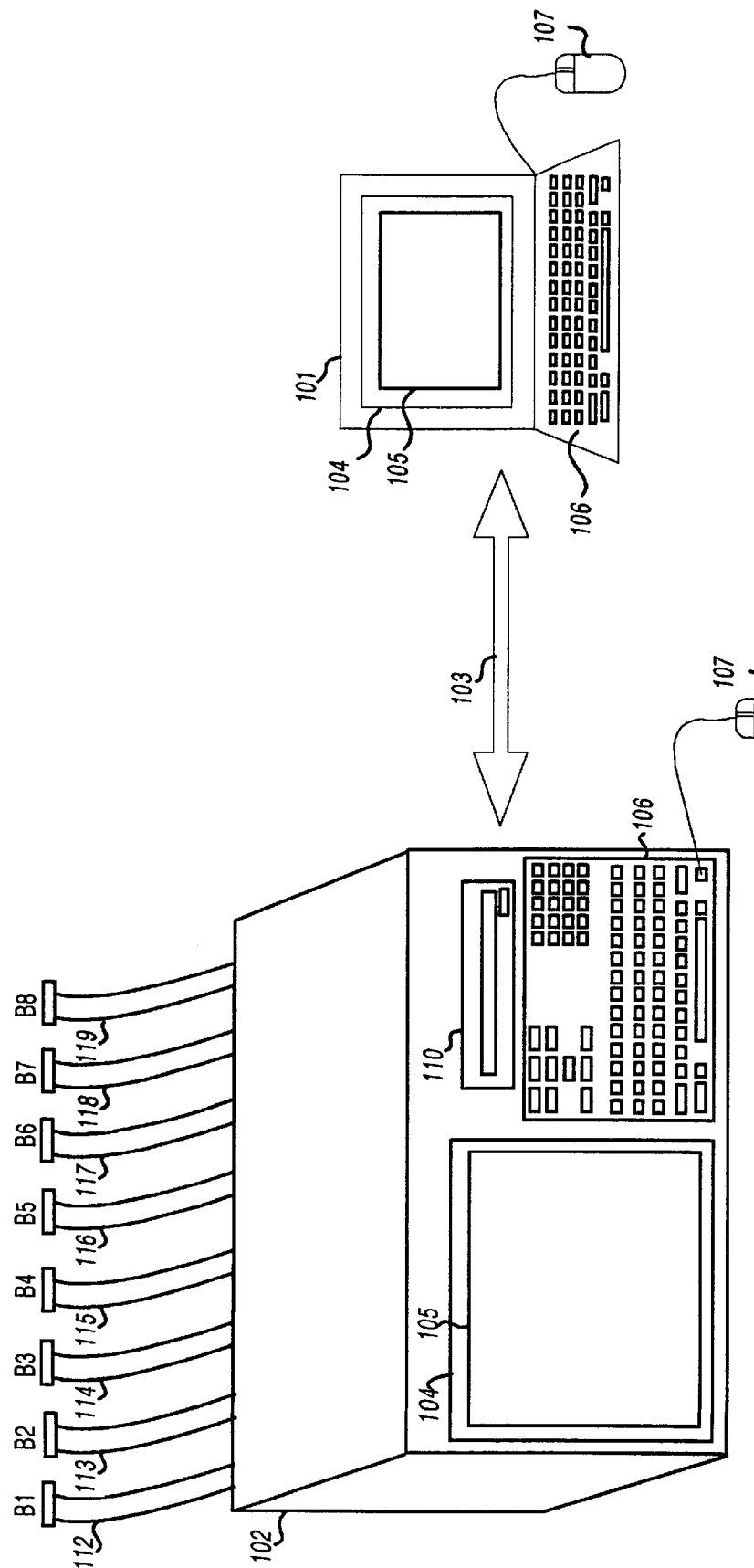
FIG. 3 is a frontal view of a logic analyzer in accordance with the invention.

FIG. 3 is a frontal view of a logic analyzer 102 such as would be used in the present invention. In the preferred embodiment, logic analyzer 102 is the Hewlett-Packard HP-16702A logic analyzer. Logic analyzer 102 is user-controlled with a keyboard 106 and mouse 107. The user may select various control menus with the keyboard 106 and mouse 107. Disc drive 110 is available for loading and storing software. Setup configuration and format screens, digital signal readouts, and digital signal waveforms are displayed on display screen 104.

Logic analyzer 102 provides a set of pods 112–119 (B1–B8), each of which comprises a pin connector which couples a set of pins to internal circuitry of logic analyzer 102 via a cable. Display 104 displays a graphical user interface 105 which allows a user to configure and set up operation of the logic analyzer 102. A remote computer 101 may communicate with logic analyzer 102 via a network connection 103. The graphical user interface 105 is operable at the remote computer 101 as well to allow remote control of the logic analyzer 102.

Figure 4A:
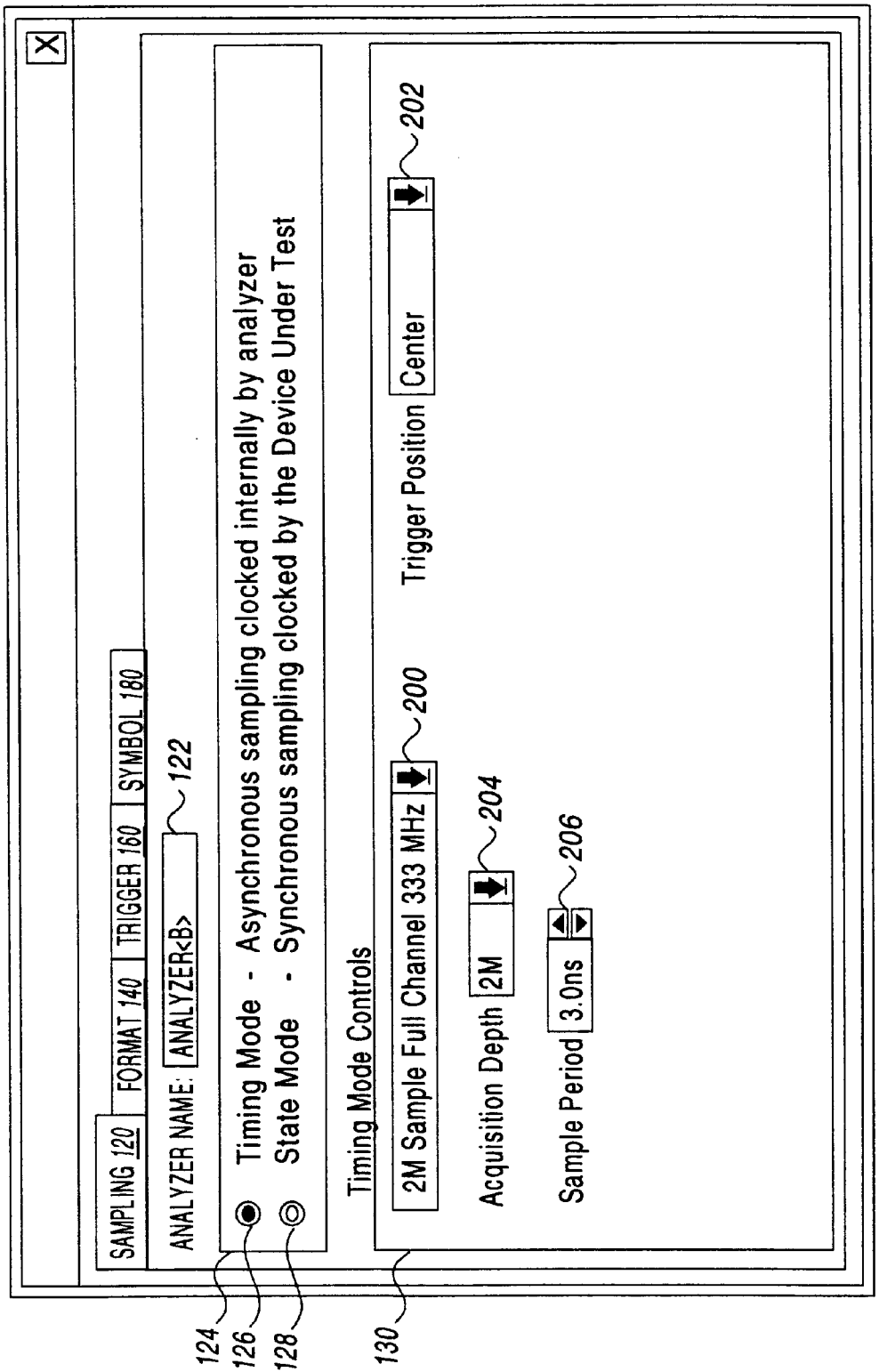
FIG. 4(a) is a user interface screen illustrating a preferred embodiment of the simplified clock setup user interface of the invention.

FIG. 4(a) is a user interface screen illustrating a preferred embodiment of the simplified clock setup user interface of the invention. As illustrated, all clock setup is performed on a single tab, in the illustrative embodiment called the Sampling tab 120. Sampling tab 120 displays the name 122 of the machine to which the sampling information applies. In this example, the name of the machine is "Analyzer<B>". Sampling tab 120 also includes an acquisition mode selection frame 124 and an acquisition mode control frame 130.

Acquisition mode selection frame 124 includes a timing mode option button 126 and a state mode option button 128. Acquisition mode selection frame 124 allows the user to define whether the machine operates in timing mode or in state mode by clicking on one or the other of the timing mode option button 126 or state mode option button 128.

Depending on which one of the timing mode option button 126 or state mode option button 128 is selected, the acquisition mode control frame 130 offers different setup controls. In the example of FIG. 4(a), Analyzer<B> is set to operate in timing mode, (i.e., sampling asynchronously and clocked internally by the analyzer clock). In this mode, acquisition mode control frame 130 comprises only the configuration options pertinent to the timing mode setup. Accordingly, acquisition mode control frame 130 includes an operating mode option button 200, which defines the operating mode of the machine. In the example of FIG. 4(a), Analyzer<B> is set to operate in full channel mode at 333 MHz with an acquisition depth of 2 Megasamples (approximately 2 million samples). Timing acquisition mode control frame 130 includes an acquisition depth window 204. A sampling period control 206 allows the user to set the period of the internal sampling clock, in this example as short as 3.0 nanoseconds. A trigger position button 202 allows the user to instruct the logic analyzer to store data measurements collected either leading up to the trigger event, after the trigger event, or evenly distributed before and after the trigger event.

Figure 4B:
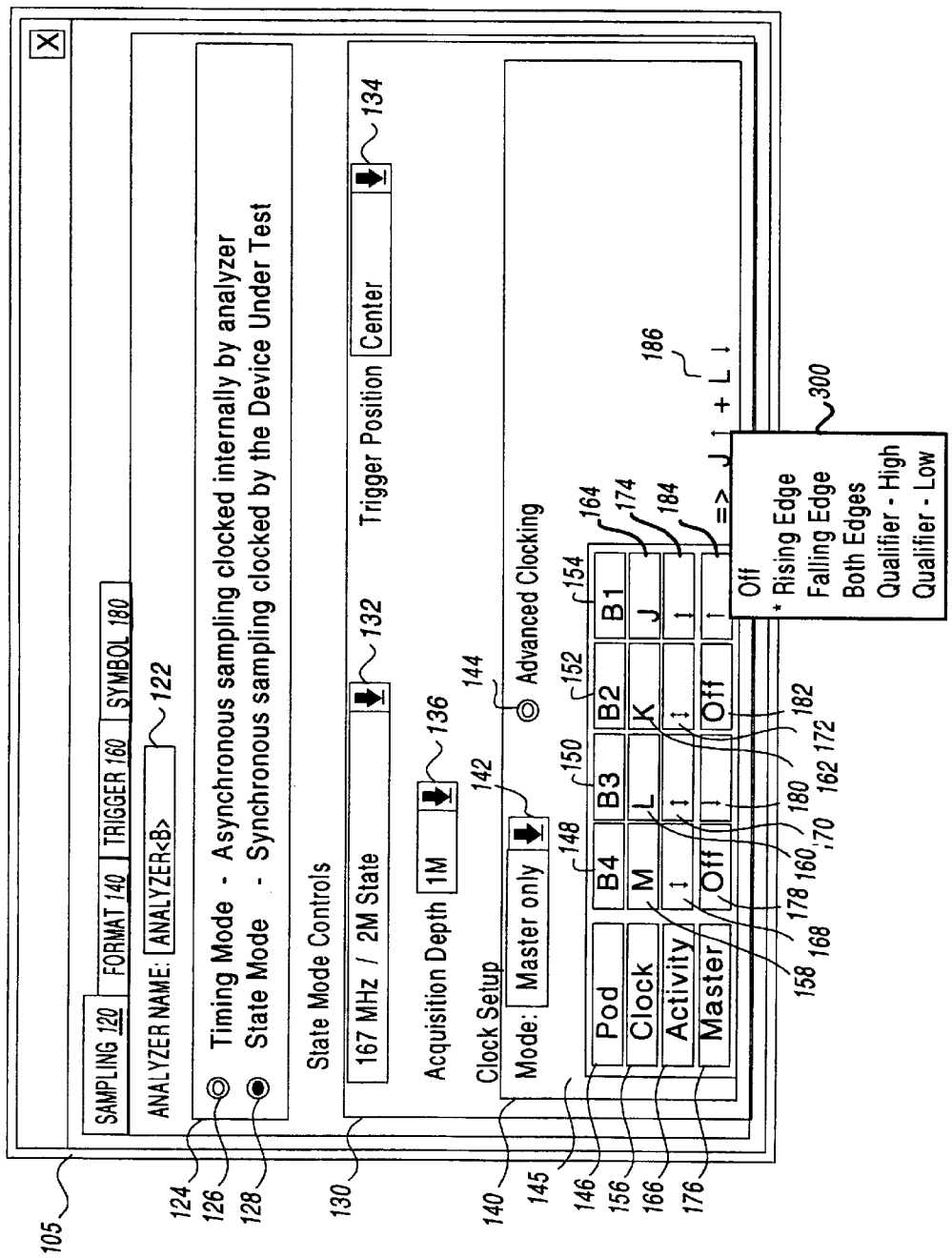
FIG. 4(b) illustrates the user interface of the invention when the machine is set to operate in state mode.

FIG. 4(b) illustrates the user interface of the invention when Analyzer<B> is set to operate in state mode, (i.e., sampling synchronously and clocked externally by the target device). In this mode, acquisition mode control frame 130 comprises only the configuration options pertinent to the state mode setup. Preferably, acquisition mode control frame 130 includes a static operating mode text box 132, which displays the operating mode of the machine. In the example of FIG. 4(b), Analyzer<B> is set to operate at 167 MHz with an acquisition depth of up to 2 Megasamples. State acquisition mode control frame 130 includes an acquisition depth control 136. A trigger position control 134 allows the user to instruct the logic analyzer to store data measurements collected either leading up to the trigger event, after the trigger event, or evenly distributed before and after the trigger event. In this example, the trigger position is set to the center so that half the data measurements are collected leading up to the trigger event and half the data measurements are collected after the occurrence of the trigger event.

In state mode, acquisition mode control window 130 includes a clock setup frame 140 and a clock specification grid 145. Clock setup frame 140 includes a clock mode control 142, which allows the user to set the clock mode to either master clock only, slave clock only, or both (demultiplex mode). Once a pod clock is assigned one of three clock arrangements, its clock follows the configuration in the master and slave clock fields. The pod clock selection made in the clock mode control 142 determines the options presented in the clock specification grid 145.

In the example of FIG. 4(b), the clock of Analyzer<B> is set to Master only. In this mode, data on all pods designated Master Clock in the same analyzer is strobed into memory when the status of the clock lines match the clocking arrangement specified under the master clock.

When the pod clock selection is made in clock mode control 142, the user sets up the clock via the clock specification grid 145. In the Master Only mode, the clock specification grid 145 comprises four rows and at least five columns. The first column on the far left contains the labels for each row and the next four columns contain all of the information for each of the available clocks. The number of columns can increase to seven or more when a logic analyzer system allows six or more clocks.

The first row 146, called pod name row 146, of clock specification grid 145 specifies the names of the analyzer pods that have clock lines. In the example shown in FIG. 4(b), the pods that have clock channels are named B1, B2, B3, and B4. In the preferred embodiment, each pod label 148, 150, 152, and 154 is color coded so that it matches the color of the label on the physical pod at the end of each logic analyzer cable.

The second row 156 in the clock specification grid 145, called clock identifier row 156, lists the clock label 168, 170, 172, 174 associated with each clock on each respective pod in the same column. In FIG. 4(b), clock J is on pod B1, clock K is on pod B2, clock L is on pod B3, and clock M is on pod B4.

The third row 166, called the activity indicator row 166, displays an activity indicator 168, 170, 172, 174 for each clock. A two-headed arrow is used as an indication that the clock line has been connected to an active clock signal, and a dash indicates that no activity is present on the line. In the example in FIG. 4(b), activity is seen on all clocks J, K, L, and M, but the logic analyzer is only utilizing clocks L and J when sampling.

The fourth row 176, called the master clock selection row 176, of the clock specification grid 145 allows clock selection for the master clock. The respective selections 178, 180, 182 and 184 associated with each clock 158, 160, 162, 164 are made via a pop-up menu button in each clock column. When a clock selection button is pressed, a pop-up menu 300 appears. Clock selection menu 300 offers the user the following six options: Off, Rising Edge, Falling Edge, Both Edges, Qualifier-High, Qualifier-Low. The user selects the appropriate option from the menu 300, and the button face displays either text or a graphic to reflect the clock selection.

Figure 4C:
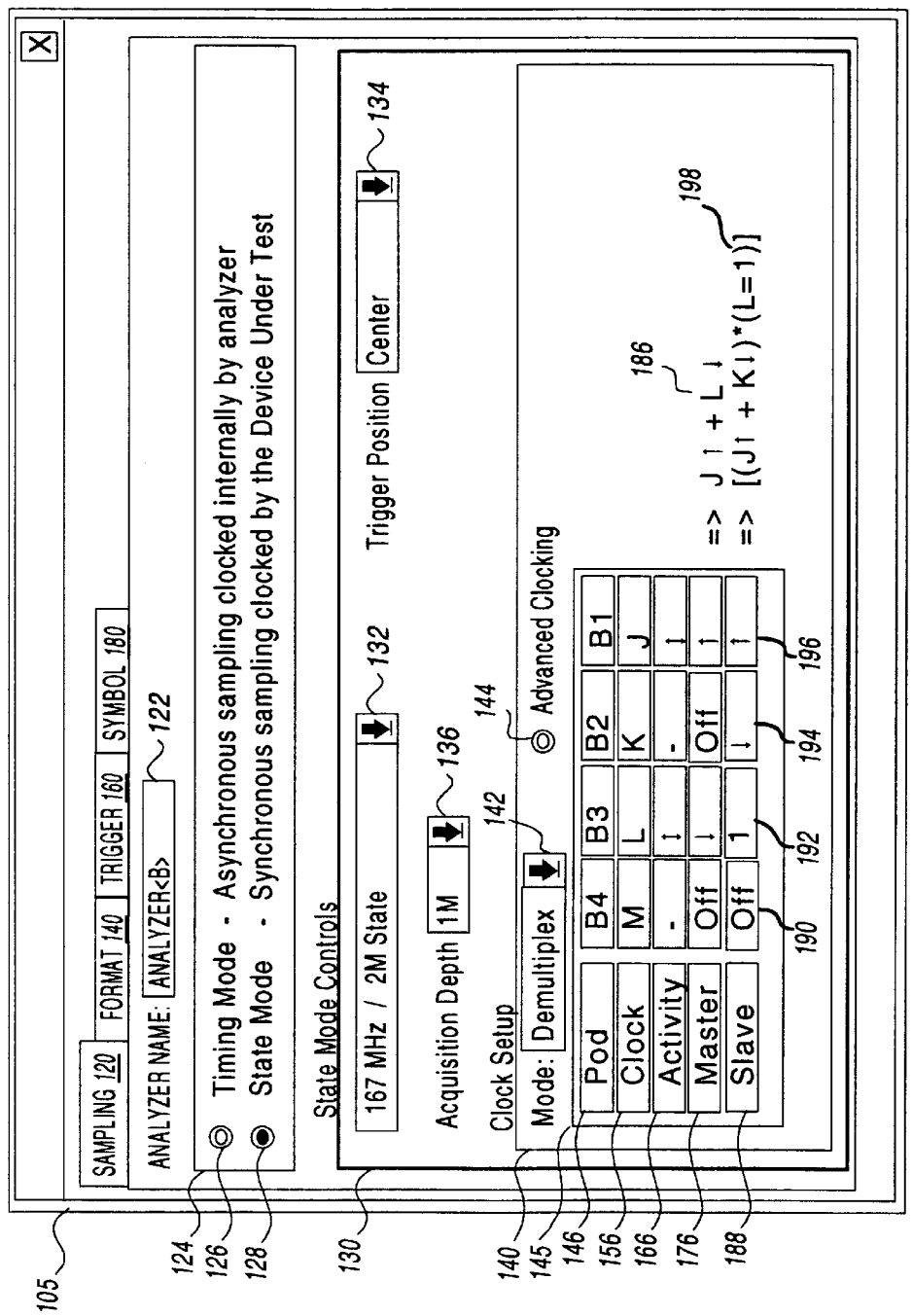
FIG. 4(c) is an illustration of the user interface of the invention when the machine clock is set to Master/Slave.

FIG. 4(c) is an example of the user interface display when the clock of Analyzer<B> is set to Master/Slave. The setup options are identical to the options presented when the clock is set to Master Only mode, but includes an additional row, called the slave clock selection row 188, in the clock specification grid 145. The slave clock selection row 188 allows the user to set up the clock selections for the slave clock. The slave clock selection buttons 190, 192, 194 and 196 are implemented with pop-up menus for each clock column. The slave clock selection button behavior is identical to the master clock selection buttons in the master clock selection row 166. Accordingly, when a slave clock selection button 190, 192, 194 and 196 is pressed, the pop-up menu 300 appears, offering the user the option of setting the slave clock to Off, Rising Edge, Falling Edge, Both Edges, Qualifier-High, or Qualifier-Low. The user selects the appropriate option from the menu 300, and the button face displays either text or a graphic to reflect the clock selection.

Using the clock specification grid 145, a user can create a wide spectrum of clock specifications from the very simple (e.g., a single edge) to the very complex (e.g., multiple edges and qualifiers). Building these Boolean equations is possible because there is an assumed Boolean relationship between the settings in each clock column. These relationships allow the user to make multiple selections in the master clock selection row 176 or slave clock selection row 188, which results in the construction of their Boolean expression, respectively displayed at 186 and 198. These Boolean expressions 186 and 198 are formed using the simple set of rules described below.:

Rule 1: All edge selections are connected to each other using a Boolean OR.

Rule 2: All qualifier selections are connected to each other using a Boolean AND.

Rule 3: No more than 2 qualifiers can be selected.

Rule 4: The qualifier equation is connected to all edges with a Boolean AND.

Figure 4D:
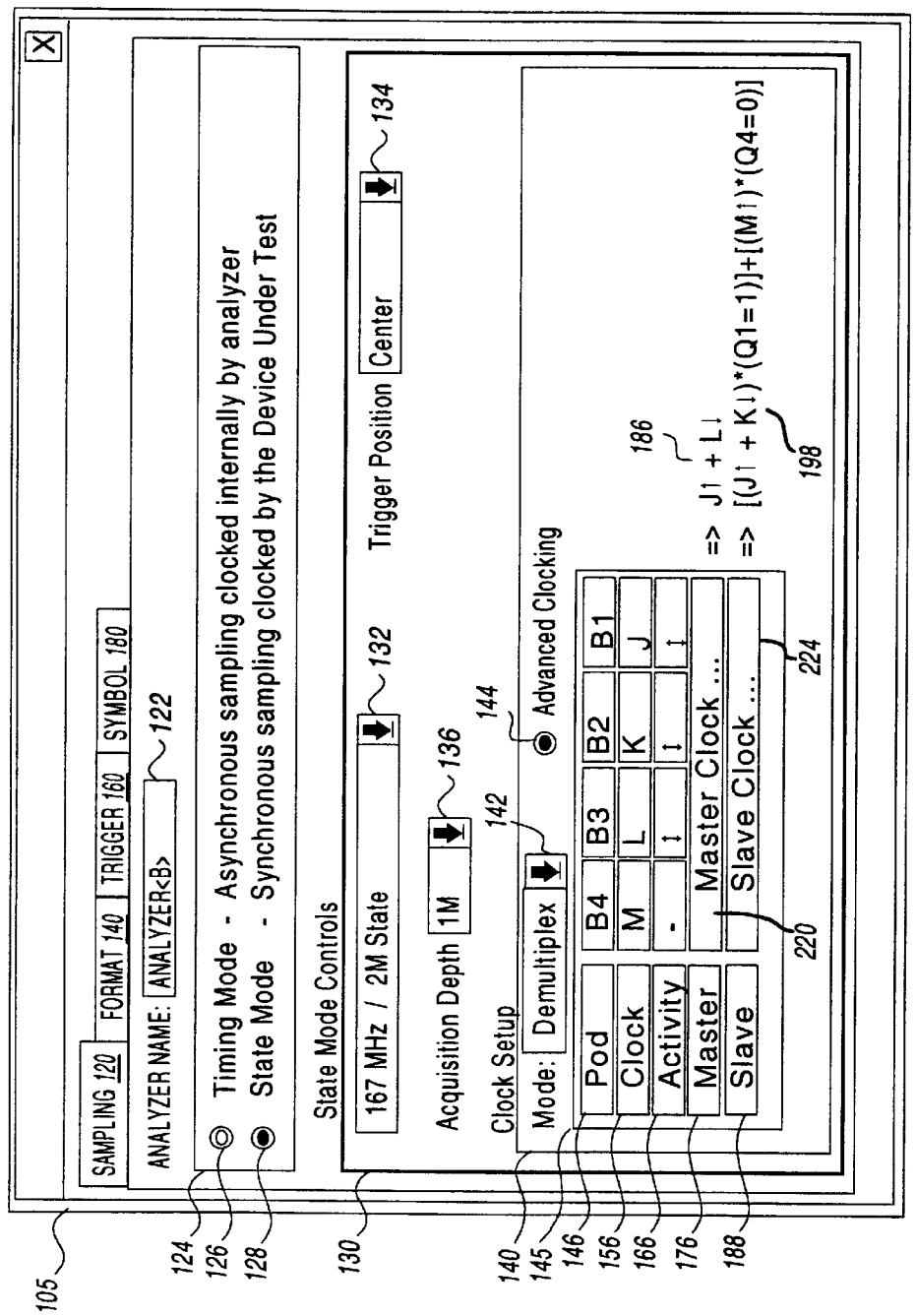
FIG. 4(d) is an illustration of the user interface display of the invention when the machine clock is set to Master/Slave with advanced clocking options.

When a user must define a specification that is not allowed by these rules (e.g., two qualifiers OR'd together or more than two qualifiers) they must use the Advanced Clocking option. Advanced clocking selection is enabled by a standard checkbox option, checked by clicking on the advanced clocking option checkbox 144, which signifies whether the clock specification grid 145 is in an advanced or basic mode. The advanced clocking option is provided to allow users to create more complex Boolean expressions than those allowed by the basic interface. When the Advanced Clocking option checkbox 144 is checked, the individual buttons displayed in each clock column for the Master and Slave clock selection rows 176 and 188 are replaced respectively with single buttons 220 and 224 as shown in FIGS. 4(d). When either the Master Clock selection button 220 or the Slave Clock selection button 224 is pressed, an advanced clock setup dialog window pops up to offer more advanced clock setup options.

FIG. 4(d) is an example of the user interface display when the clock of Analyzer<B> is set to Master/Slave with advanced clocking options enabled by checking the advanced clocking option checkbox 144. Again, the setup options are identical to the options presented when the clock is set to Master/Slave mode as shown in FIG. 4(c), except that the master clock selection row 176 and slave clock selection row 188 in the clock specification grid 145 display a single respective master clock selection button 220 and slave clock selection button 224. The respective master clock selection button 220 and slave clock selection button 224 are pop-up window buttons that display a respective master clock selection window and slave clock selection window when clicked on by the user.

Figure 4E:
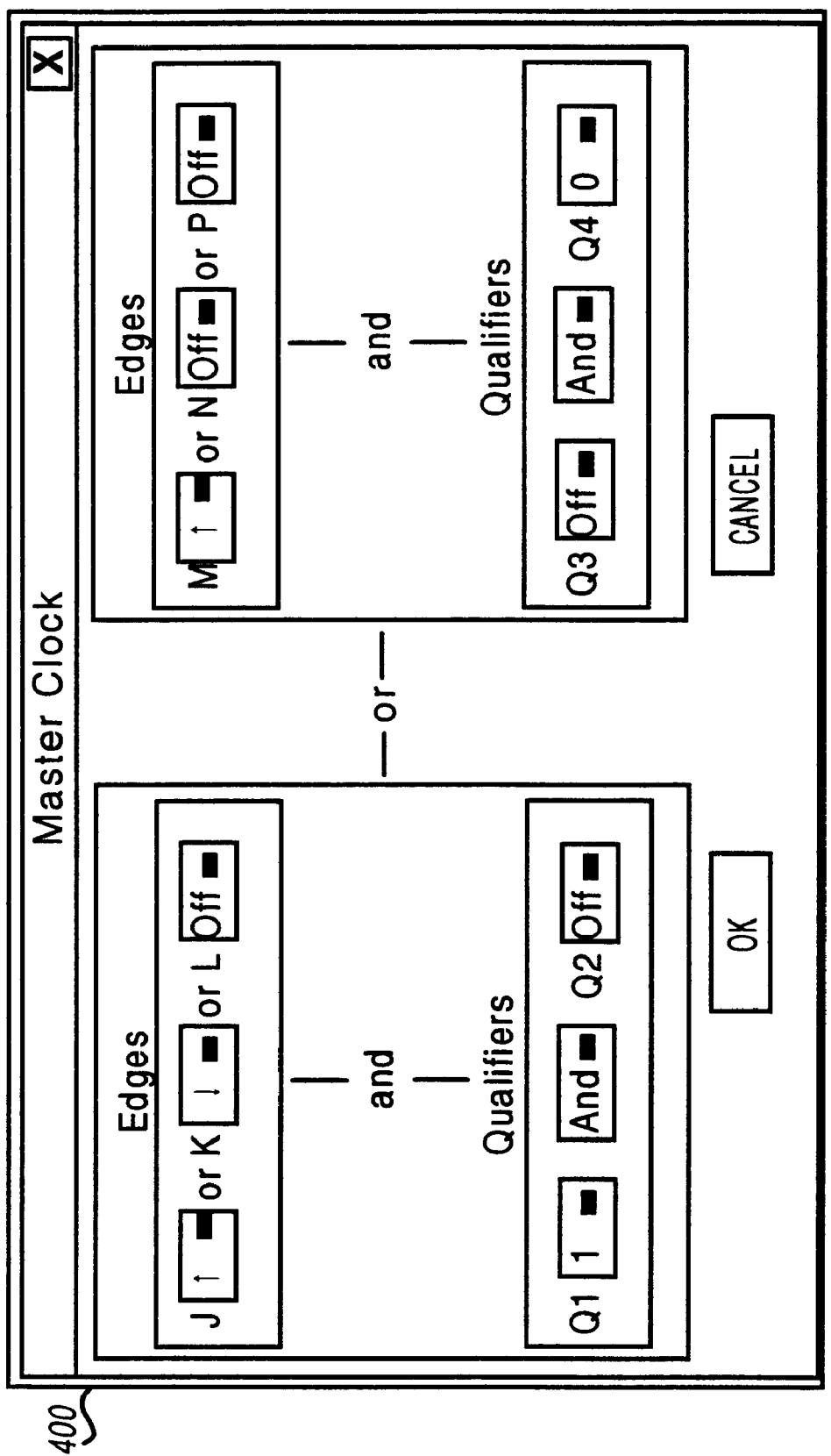
FIG. 4(e) is an illustration of a master clock selection window for the user interface display of the invention.

FIG. 4(e) is an example of a master clock selection window 400 in accordance with the invention that offers more advanced clocking options.

The slave clock selection window is preferably identical to the master clock selection window 400 but applies the selections made to the slave clock rather than the master clock.

The Boolean equations 186 and 198 to the right of the respective master clock specification row 176 and slave clock specification row 188 in the clock specification grid 145 are updated with each selection the user makes for the Master and/or Slave clocks. The Boolean expressions 186 and 198 are defined by following the rules described above. This expression is displayed to give the user a quick reference to verify that they have configured the clocks as desired. Boolean expressions 186 and 198 in FIG. 4(d) illustrate a fairly complicated Boolean expression that is specified using the advanced options master and slave clock selection window interface.

It will be appreciated from the above description and with reference to FIGS. 4(b)–4(d), that the present invention significantly improves over the prior art logic analyzer user interfaces in terms of display efficiency and ease of navigation. Using the improved logic analyzer user interface of the invention, all clock selection and configuration activity for most applications is performed and displayed on a single graphical user interface tab. On this tab, a user can confirm clock activity and verify which clock label is associated to which analyzer pod without navigating to a different screen. In addition, color-coding is used to reinforce the relationship between the pod label defined in the user interface and the physical logic analyzer pod. A user can also quickly specify the master and slave clock settings on the same screen. An additional dialog only needs to be opened when very complicated clock specifications are necessary. In addition, the compact space requirements of the improved user interface design allows it to be placed on the same screen as other associated sampling options, such as machine mode setup and controls. Finally, the simplified clock setup design of the invention allows a much cleaner, more intuitive presentation of information and options.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A graphical user interface for a logic analyzer comprising a plurality of pods that connect to a device under test, said graphical user interface operative to receive and interpret logic analyzer signals to display logic analyzer information for a user, and to receive and interpret user input to configure said logic analyzer in accordance with said user input, said graphical user interface comprising:

a plurality of pod labels each of which corresponds to one of said plurality of pods of said logic analyzer that has a clock line and identifies a respective pod name for its respective corresponding analyzer pod of said logic analyzer;

a plurality of clock labels each of which corresponds to one of said plurality of pods identified by a respective pod label and identifies each clock associated with its corresponding pod;

a plurality of activity indicators each of which corresponds to one of said plurality of pods identified by a respective pod label and indicates activity present on said clock associated with its corresponding pod; and a first plurality of clock selection buttons each of which corresponds to one of said plurality of pods identified by a respective pod label and allows said user to select a clock edge for said clock associated with its corresponding pod;

wherein each of said plurality of pod labels, said plurality of clock labels, said plurality of activity indicators, and said first plurality of clock selection buttons are displayed in a single window.

2. A graphical user interface in accordance with claim 1, a clock specification grid comprising:

a pod identifier row comprising said plurality of pod labels arranged in a row;

a clock identifier row comprising said plurality of clock labels arranged in a row;

an activity indicator row comprising said plurality of activity indicators; and a first clock selection row comprising said first plurality of clock selection buttons;

wherein said pod identifier row, said clock identifier row, said activity indicator row, and said first clock selection row are arranged to align each of said respective pod labels, clock labels, activity indicators and clock selection buttons that correspond to a like corresponding pod in a like column.

3. A graphical user interface in accordance with claim 1, wherein:

said first plurality of clock selection buttons allow said user to select said respective clock to be Off, Rising Edge, Falling Edge, Both Edges, Qualifier-High, Qualifier-Low.

4. A graphical user interface in accordance with claim 1, wherein:

said master clock selection button displays said selected clock selection option.

5. A graphical user interface in accordance with claim 1, comprising:

a clock mode control which allows said user to set a clock mode of said logic analyzer, said clock mode determining said options presented in said single window.

6. A graphical user interface in accordance with claim 5, wherein:

said clock mode may be set to one of either a master clock mode, a slave clock mode, or a demultiplex mode.

7. A graphical user interface in accordance with claim 5, comprising:

an operating mode control, which defines an operating mode in which said logic analyzer operates, said operating mode comprising at least a state mode and a timing mode.

8. A graphical user interface in accordance with claim 7, wherein:

said clock setup frame comprises an acquisition depth window which allows said user to select an amount of data samples to be stored.

9. A graphical user interface in accordance with claim 1, wherein:

said first plurality of clock selection buttons in said first clock selection row each allow said user to select a master clock edge for said associated clock when said clock is to be set up as a master clock.

10. A graphical user interface in accordance with claim 9, comprising:

a second plurality of clock selection buttons each of which corresponds to one of said plurality of pods identified by a respective pod label and allows said user to select a clock edge for said clock associated with its corresponding pod.

11. A graphical user interface in accordance with claim 10, wherein:

said second plurality of clock selection buttons in said second clock selection row each allow said user to select a slave clock edge for said associated clock when said clock is to be set up as a slave clock.

12. A graphical user interface in accordance with claim 11, wherein:

said clock specification grid comprises:

a second clock selection row comprising said second plurality of clock selection buttons.

13. A graphical user interface in accordance with claim 1, comprising:

an advanced clocking option which opens an advanced clock selection window that allow said user to select advanced clocking functions.

14. A graphical user interface in accordance with claim 1, wherein:

each of said pod labels is color coded to match the color of the label on said corresponding pod of said logic analyzer.

* * * * *